United States Patent [19]

Parks et al.

[11] Patent Number: 4,778,258

[45] Date of Patent: Oct. 18, 1988

[54] PROTECTIVE TAB STRUCTURE FOR USE IN THE FABRICATION OF MATRIX ADDRESSED THIN FILM TRANSISTOR LIQUID CRYSTAL DISPLAYS

[75] Inventors: Harold G. Parks; William W. Piper, both of Scotia; George E. Possin, Schenectady, all of N.Y.

[73] Assignee: General Electric Company, Schenectady, N.Y.

[21] Appl. No.: 104,452

[22] Filed: Oct. 5, 1987

[51] Int. Cl.$^4$ .............................................. G02F 1/13
[52] U.S. Cl. ................................... 350/336; 350/333; 350/334; 437/180; 437/189; 437/192; 357/23.4; 357/23.7
[58] Field of Search ............ 350/333, 336, 334, 339 R; 437/180, 181, 189, 192, 194; 29/569.1, DIG. 16, DIG. 95; 357/23.4, 23.7, 23.9, 23.11

[56] References Cited

U.S. PATENT DOCUMENTS

| 4,436,582 | 3/1984 | Saxena | 437/192 X |
| 4,485,553 | 12/1984 | Christian et al. | 437/180 |
| 4,632,725 | 12/1986 | Hartmann et al. | 437/192 X |
| 4,676,603 | 6/1987 | Fertig | 350/336 |
| 4,687,298 | 8/1987 | Aoki et al. | 357/23.7 X |
| 4,697,331 | 10/1987 | Boulitrop et al. | 350/336 X |
| 4,705,358 | 11/1987 | Yamazaki et al. | 357/23.7 X |
| 4,738,749 | 4/1988 | Maurice et al. | 437/189 X |

FOREIGN PATENT DOCUMENTS

| 0136509 | 4/1985 | European Pat. Off. | 350/336 |
| 58-198025 | 11/1983 | Japan | 350/336 |
| 60-17422 | 1/1985 | Japan | 350/336 |

OTHER PUBLICATIONS

"Silicon TFTs for Flat Panel Displays", by F. Morin and M. LeContellec, Hewlett Packard Journal.
"Amorphous-Silicon Thin-Film Metal-Oxide-Semiconductor Transistors", by Hiroshi Hayama and Masakiyo Matsumura, *Applied Physics Letters*, vol. 36, No. 9 (May 1980).
"Amorphous Silicon-Silicon Nitride Thin-Film Transistors" by M. J. Powel et al., *Applied Physics Letters*, vol. 38, No. 10 (May 1981).
"Application of Amorphous Silicon Field Effect Transistors in Addressable Liquid Crystal Display Panels" by A. J. Snell et al., *Applied Physics*, vol. 24, pp. 357-362 (1981).
"A TFT-Addressed Liquid Crystal Color Display" by M. Suguta et al. (Oct. 1983), Proceedings of the Third International Display Research Conference, Paper No. 53.
"Amorphous-Silicon TFT Array for LCD Addressing" by M. V. C. Stroomer, Electronic Letters, vol. 18, No. 20 (1982).
"High Resolution Transparent-Type a-Si TFT LDCs" by K. Suzuki et al., *SID Digest*, (1983).
"Promise and Challenge of Thin-Film Silicon Approaches to Active Matrices" by A. I. Lakatos, 1982 International Display Research Conference, IEEE, pp. 146-151.
"Application of Amorphous Silicon Field Effect Transistors in Integrated Circuits" by A. J. Snell et al., *Applied Physics*, vol. A26, pp. 83-86.

Primary Examiner—Stanley D. Miller
Assistant Examiner—Richard F. Gallivan
Attorney, Agent, or Firm—Marvin Snyder; James C. Davis, Jr.

[57] ABSTRACT

A process for the fabrication of thin film field effect transistors in active matrix liquid crystal display devices includes the utilization of a protective, conductive tab disposed on a corner portion of the pixel electrodes. Electrical contact is made to the pixel electrodes not directly, but rather through a via opening in protective, insulative and amorphous silicon layers. The structure is particularly advantageous in that it permits the utilization of a wider range of gate and upper level metallization materials, particularly aluminum, whose etchants are otherwise found deleterious to pixel electrode material such as indium tin oxide. The structure of the present invention is seen to be readily fabricatable in accordance with high yield fabrication procedures.

16 Claims, 3 Drawing Sheets

PROTECTIVE TAB STRUCTURE FOR USE IN THE FABRICATION OF MATRIX ADDRESSED THIN FILM TRANSISTOR LIQUID CRYSTAL DISPLAYS

BACKGROUND OF THE INVENTION

The present invention is generally directed to a process for the fabrication of thin film field effect transistor structures useful in matrix addressed liquid crystal displays (LCDs). The present invention is also directed to structures produced in accordance with the process. More particularly, the present invention is directed to the utilization of a protective tab structure disposed on a portion of a pixel electrode for the purpose of protecting pixel electrode material from attack by chemicals employed in other process stages. More particularly, the present invention is directed to one solution to the material process compatibility problems associated with the utilization of indium tin oxide as a pixel electrode material in conjunction with aluminum as a gate metal and/or as source/drain metallization material.

A liquid crystal display device comprises a pair of flat panels sealed at their outer edges and containing a quantity of liquid crystal material. These liquid crystal materials typically fall into two categories: dichroic dyes and a guest/host system or twisted nematic materials. The flat panels generally possess transparent electrode material disposed on their inner surfaces in predetermined patterns. One panel is often covered completely by a single transparent "ground plane" electrode. The opposite panel is configured with an array of transparent electrodes, referred to herein as "pixel" (picture element) electrodes. Thus, a typical cell in a liquid crystal display includes liquid crystal material disposed between a pixel electrode and a ground electrode forming, in effect, a capacitor-like structure disposed between adjacent front and back panels. It is noted that transparency is generally required for only one of the two panels and the electrodes disposed thereon.

In operation, the orientation of liquid crystal material is affected by voltages applied across electrodes disposed on opposite sides of the liquid crystal material. Typically, voltages applied to the pixel electrode effect a change in the optical properties of the liquid crystal material. This optical changes causes the display of information on the liquid crystal display screen. In conventional digital watch displays and in some LCD screens used in miniature television receivers, the visual effect is typically produced by variations in reflected light. However, the utilization of transparent front and back panels and transparent electrodes also permits visual effects to be produced by transmissive effects. This transmissive effect may be facilitated by separately powered light sources for the display, including fluorescent light type devices. LCD display screens may also be employed to produce color images through the incorporation of color filter mosaics and registration with the pixel electrode array. Some displays may also provide polarizing filters to either enhance or provide the desired visual effect.

Various electrical mechanisms are employed to sequentially turn on and off individual pixel elements on an LCD screen. For example, metal oxide varistor devices have been employed for this purpose. However, the utilization of thin film semiconductor switch elements is most relevant herein. In particular, the switch element of the present invention comprises a thin film field effect transistor (FET) employing a layer of amorphous silicon. These devices are preferred in LCD devices because of their potentially small size, low power consumption, switching speeds, ease of fabrication and compatibility with conventional LCD structures. However, the fabrication processes for certain desired switch element structures have been found to be incompatible with the employment of certain materials used in the transparent LCD electrodes. It is seen that while certain physical FET structures or LCD devices are desirable, it is often extremely difficult to devise processes that satisfactorily produce the desired structure. Moreover, in any process of the kind contemplated herein, the number of masking steps is desired to be low since, in general, the greater the process complexity, the lower is the reliability of the resulting device and the process yield. One of the material problems that can arise in the fabrication of thin film FETs for LCD screens is the problem of providing good electrical contact between source and drain line metal and the amorphous silicon layer of the FET. In general, molybdenum has been a metal which has been employed for source and/or drain electrode pads. However, molybdenum does not necessarily exhibit good elctrical contact with intrinsic amorphous silicon. A thin layer of aluminum disposed between the molybdenum and the amorphous silicon may be provided as discussed in previously filed application Ser. No. 761,939 filed Aug. 2, 1985, now abandoned, which is assigned to the same assignee as the present invention. However, care must be taken to avoid etchant compatibility problems with indium tin oxide which is preferably employed for the pixel electrodes. Moreover, aluminum has a tendency to diffuse into silicon material, thus potentially degrading device performance if high temperatures are employed in subsequent process steps.

Another problem encountered in LCD devices is the tendency for capacitive discharge to occur during off cycles. In this situation, the capacitor formed by the pixel electrode, the ground plane electrode and the liquid crystal material as a dielectric, tends to discharge through the FET if the FET device characteristics are inappropriate. In particular, it is desirable to limit FET current under conditions of reverse gate voltage. If the source-drain current is high under these conditions, capacitive leakage tends to occur and this can affect display quality. It is also desirable that the current-voltage characteristics do not exhibit large hysteresis loops since this can result in voltage uncertainty on the pixel electrode.

Attention is now specifically directed to particular problems of FET and LCD fabrication. In particular, aluminum is a desirable choice for gate level metallization in that it exhibits a higher electrical conductivity and is more optically opaque than titanium. Optical opacity for gate material is desired to reduce light-induced charge leakage through the FET. However, aluminum is attacked by most wet etchants which also etch molybdenum and can also react with indium tin oxide in the transparent pixel electrode material to produce a so-called "Swiss cheese effect" on the pixel elements. It is also desirable to be able to employ aluminum as a source/drain level metallization material. However, materials which etch aluminum can also have a deleterious effect upon ITO pixel electrode material, apparently as a result of attack by $Al^{+++}$ ions.

SUMMARY OF THE INVENTION

In accordance with a preferred embodiment of the present invention, a process is provided for the fabrication of thin film field effect transistors in active matrix liquid crystal display devices. First, a gate metallization pattern is disposed on an insulative substrate. This pattern includes gate electrodes and gate drive lines. Next, a pixel electrode pattern is disposed on the same substrate. Most particularly in accordance with the present invention, the next process step disposes a protective, conductive tab, typically comprising a material such as molybdenum on a portion of each of the pixel electrodes. Next, a layer of protective insulative material such as silicon nitride is disposed over the gate metallization layer, the pixel electrodes and the conductive tabs. Next, a layer of intrinsic amorphous silicon is disposed over the protective insulative layer. Source and drain metallization layers are disposed over the intrinsic amorphous silicon. The source and drain metallization layer is patterned, after which the intrinsic amorphous silicon and protective insulative layers are patterned down to the level of the insulative substrate and the pixel electrode material so as to form thin film field effect transistor devices associated with the pixel electrodes in the pixel electrode pattern. In general, each pixel electrode is associated with one thin film FET device. Another embodiment of the present invention also includes a cell structure for matrix addressed liquid crystal displays produced in accordance with the process described above.

The process and resulting structure described above exhibit certain process advantages. In particular, the pixel electrode material is protected during processing by the protective insulative layer (typically silicon nitride). Furthermore, the use of the conductive tab in a corner portion of the pixel electrode permits via openings to be made through the amorphous silicon and protective insulative layers down to a material such as molybdenum which is not sensitive to etchants employed in patterning the source/drain metallization layer. This process and structure permits greater flexibility in the choice of both gate level and source/drain metallization layer materials. In particular, the desirable use of aluminum is made much more practicable.

Accordingly, it is an object of the present invention to provide an amorphous silicon field effect transistor process and structure which substantially isolates the pixel electrode material from the rest of the display during the fabrication process steps.

It is yet another object of the present invention to protect the indium tin oxide pixel electrode material with a continuous dielectric barrier during patterning of aluminum source/drain electrodes by wet chemistry.

It is a still further object of the present invention to provide via openings for making electrical contact to the pixel electrode material.

It is also an object of the present invention to improve electrical continuity and enhance contact between source/drain metallization material and pixel electrode material.

It is yet another object of the present invention to expand the choices available for gate metallization material and also for source and drain metallization layer material.

It is a still further object of the present invention to enhance the optical isolation of the FET by providing gate metallization material exhibiting greater opacity.

Lastly, but not limited hereto, it is an object of the present invention to increase fabrication yield in matrix addressed liquid crystal display manufacturing processes.

DESCRIPTION OF THE FIGURES

The subject matter which is regarded as the invention is particularly pointed out and distinctly claimed in the concluding portion of the specification. The invention, however, both as to organization and method of practice, together wih further objects and advantages thereof, may best be understood by reference to the following description taken in connection with the accompanying drawings in which:

DETAILED DESCRIPTION OF THE INVENTION

Figure 1:
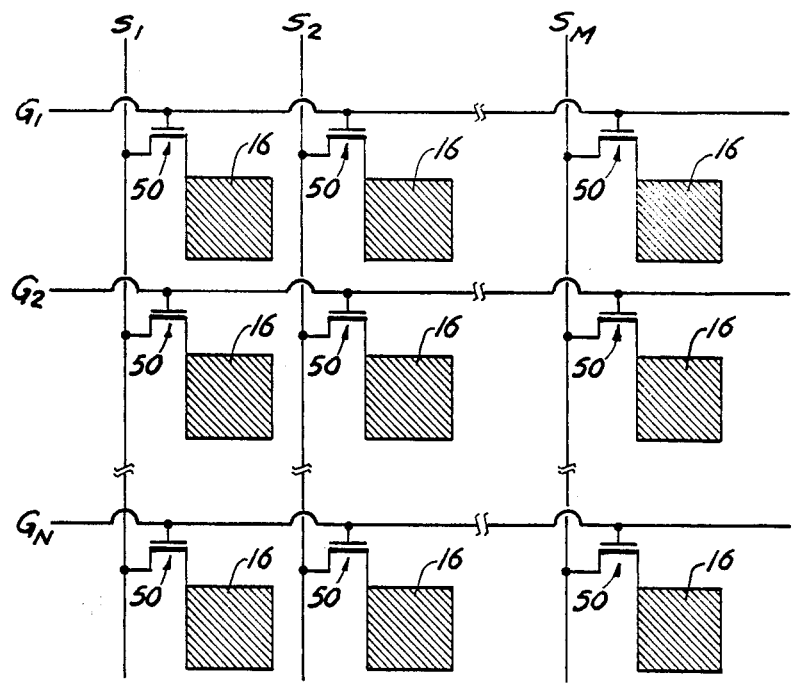
FIG. 1 is a partially schematic electrical circuit diagram illustrating the context in which the processes and structures of the present invention are employed.

FIG. 1 illustrates, in schematic diagram form, a matrix addressed liquid crystal display circuit. In particular, there is shown an N row by M column array of pixel electrodes 16 together with associated FET switching elements 50. The gate electrodes of the switching elements in row i are connected to gate drive line $G_i$. Likewise, the source electrode in column j is connected to data or source line $S_j$. In the figure shown, j ranges from 1 to M and i ranges from 1 to N. It should be realized, however, that many FET structures are symmetric with respect to source and drain properties and that in many situations, the source and drain connections can be reversed or are referred to by different names than herein. It can therefore become simply a matter of convention as to what is referred to as the source and drain connection. However, FIG. 1 particularly shows each pixel electrode 16 being connected to the "drain" of its associated switching FET. In operation, the pixel element in the $i^{th}$ row and in the $j^{th}$ column is switched on by simultaneously applying appropriate signals to gate $G_i$ and data or source line $S_j$. This supplies a voltage to a pixel electrode which acts to alter the optical properties of liquid crystal materials disposed between the selected pixel electrode and the ground plane or counter electrode (not visible in FIG. 1, see reference numeral 76 in FIG. 2). Pixel electrode 16 preferably comprises a transparent conductive material such as indium tin oxide.

Figure 2:
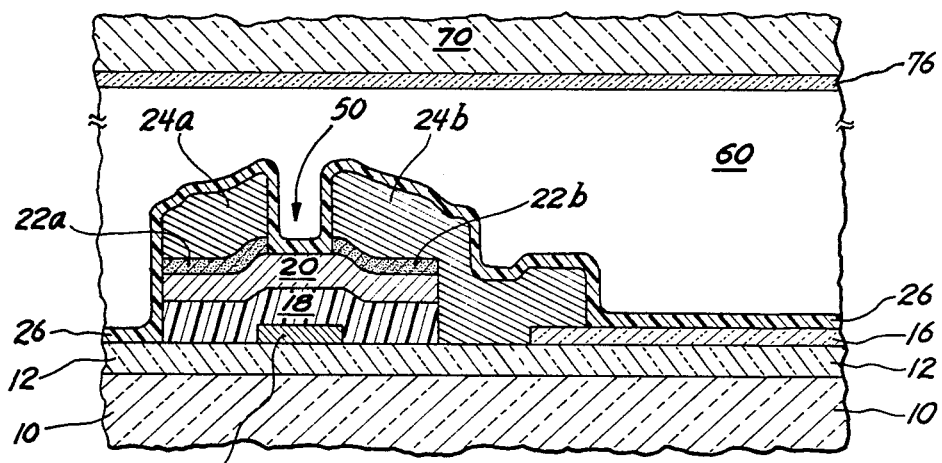
FIG. 2 is a cross-sectional, side elevation view of a portion of an LCD pixel cell produced in accordance with process steps which do not include protective pixel electrode tabs or via opening connections to pixel electrode material

FIG. 2 illustrates a portion of a liquid crystal display device which is not specifically in accordance with the present invention. Even though the pixel cell portion shown in FIG. 2 does not correspond to all of the structures or processes embodying the present invention, it is nonetheless instructive to consider it for the differences which will become apparent. More particularly, FIG. 2 illustrates both the upper and lower panels for an LCD display. Also illustrated is the physical relationship between the field effect transistor 50 structure and a pixel electrode 16. In FIG. 2, there is shown upper LCD panel 70 which is typically comprises a material such as glass. Also disposed on the lower surface of panel 70 is a thin coating of a material such as indium tin oxide 76 which acts as a transparent counter electrode or ground plane electrode. Electrical potential differences appearing between ground plane electrode 76 and pixel electrode 16 produce optical variations in liquid crystal material 60 disposed between these electrodes. The optical effects produced by this potential difference cause information to be displayed on the LCD screen. FET 50 and pixel electrode 16 are disposed on an insulative coating 12 on lower LCD display panel 10. Coating 12 typically comprises a material such as silicon dioxide. Panel 10 typically comprises a material such as glass. In general, panel 70, panel electrode 76, pixel electrode 16, coating 12 and panel 10 may all comprise transparent material. This is particularly useful in LCD displays in which back lighting is employed to form or assist in forming the desired image. However, it is only necessary for either upper panel 70 and coating 76 or lower substrate 10, together with its associated pixel electrode material, to be transparent. As indicated above, pixel electrodes 16 are disposed on one of the LCD display panels. It is also necessary to connect each pixel electrode 16 with its associated semiconductor switching element 50. In the device shown in FIG. 2, semiconductor switching element 50 comprises an amorphous-silicon-based field effect transistor which includes gate electrode 14. While only a portion of electrode 14 is visible in the cross-section of FIG. 2, it must be kept in mind that the metallization pattern in this layer is disposed in a two dimensional fashion over a relatively flat substrate, forming not only gate electrode 14, but also gate lines $G_i$. In the structure illustrated in FIG. 2 moreover, there are more severe restrictions in the nature of the materials which may be employed for gate electrode 14. In particular, for structures such as those shown in FIG. 2, titanium is a preferred gate electrode material as long as process steps compatible with its use are employed. Over gate electrode 14, there is disposed an insulative layer 18 typically comprising a protective insulative material such as silicon nitride. Over insulative layer 18, there is disposed an active layer of amorphous silicon 20. In general, it is desirable to dispose source and drain electrode material in direct contact with active amorphous silicon material 20. However, desirable material such as molybdenum employed in the source and drain metallization layer may not form good electrical contact with intrinsic amorphous silicon. While a layer of N+ oped amorphous silicon may be employed as an intermediate layer to facilitate and enhance electrical connection to amorphous silicon material, it is one of the features of the present invention that a metal such as aluminum may be readily employed for the source and drain metallization layer. However, in the structure shown in FIG. 2, N+ amorphous silicon layers 22a and 22b are employed in conjunction with molybdenum electrodes 24a and 24b, respectively. At the same time, drain electrode 24b and source electrode 24a are fabricated and disposed so as to provide electrical contact to pixel electrode 16, as shown. Finally, a layer of passivation material 26, such as silicon nitride, is disposed over the lower LCD display substrate. It should be noted that FIG. 2 does not indicate the use of via openings for electrical contact between electrode 24b and pixel electrode 16.

Attention is now specifically directed to FIGS. 3-7 herein in which process steps in accordance with the present invention are illustrated. In particular, it is observed in these figures that protective, conductive tab 11 is employed to protect pixel electrode material from attack by wet etchants.

Figure 3:
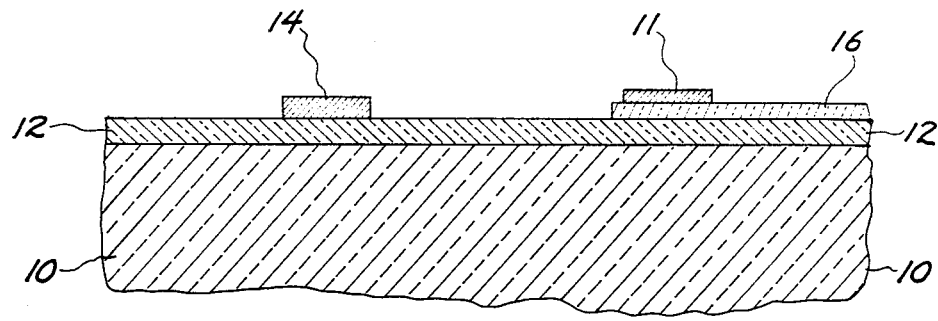
FIGS. 3–7 are cross-sectional side elevation views of a portion of an LCD pixel cell as existing in various steps of a process for manufacture in accordance with the present invention, the resulting structure being most particularly shown in FIG. 7.
Figure 4:
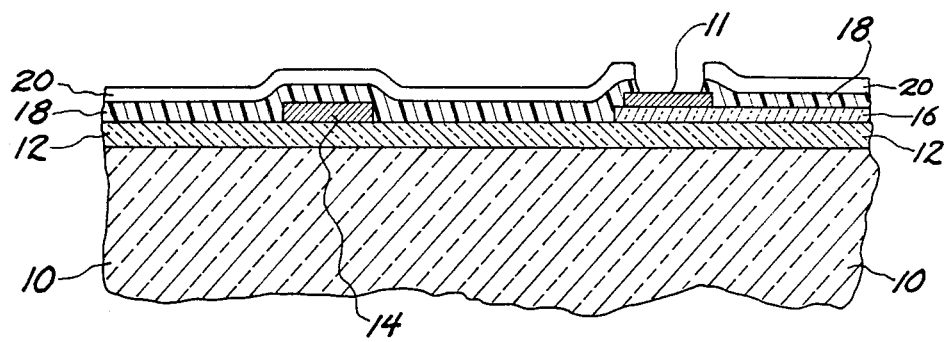

FIG. 3 particularly illustrates an early stage in the desired process. In preferred embodiments of the present invention, gate metallization layer 14 is deposited and patterned. Gate metallization patterning includes gate electrode 14, visible in the cross-sections of FIGS. 3-7, and also gate drive line patterns which are more particularly illustrated in FIG. 1. Gate electrode 14 may comprise material such as aluminum, titanium or molybdenum. However, if aluminum is employed as a gate metal material, then it is highly desirable that it be deposited and patterned prior to deposition and patterning of indium tin oxide pixel electrode 16. As pointed out above, the reason for this is the desire to avoid contact between aluminum etchants and pixel electrode material. However, when it is also desirable to be able to employ aluminum in upper level metallization layers, such as those used for source and drain contacts, it is also necessary to protect pixel electrode material 16 from attack by etchants employed in upper level metallization patterning. Accordingly, in accordance with the present invention, protective conductive tab 11 is deposited on a portion of pixel electrode 16. Preferably, tab 11 is disposed in a corner of pixel electrode 16 adjacent to its associated switching element 50. Tab 11 preferably comprises a material such as molybdenum deposited by sputtering.

Next, a layer of protective insulative material such as silicon nitride is disposed over the workpiece seen in FIG. 3. The protective insulative material is preferably disposed by plasma enhanced chemical vapor deposition. Following the disposition of insulative layer 18, which also acts as a gate dielectric material, a layer of intrinsic amorphous silicon 20 is disposed over layer 18. Intrinsic amorphous silicon layer 20 provides the active semiconductor material for operation of the switching devices herein. Intrinsic amorphous silicon layer 20 is also preferably deposited by plasma enhanced chemical vapor deposition.

In preferred embodiments of the present invention, gate metallization is disposed by chemical vapor deposition and plasma etching. Also, the pixel electrode pattern is preferably disposed by sputter deposition and wet etching. Next, an opening is provided in protective insulative layer 18 and intrinsic amorphous silicon layer 20 so as to enable electrical contact to protective, conductive tab 11. This via opening is smaller in size than tab 11, so as not to permit exposure of pixel electrode 16 to subsequent etchants. The via opening is provided by a resist, masking and etching step sequence.

Figure 5:
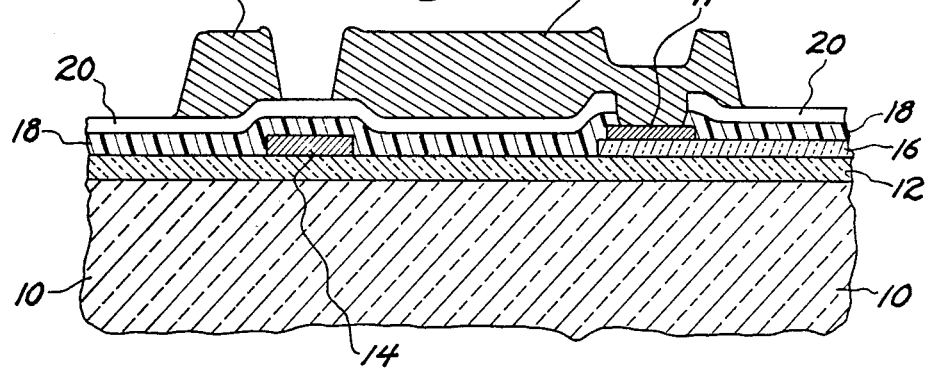
Figure 6:
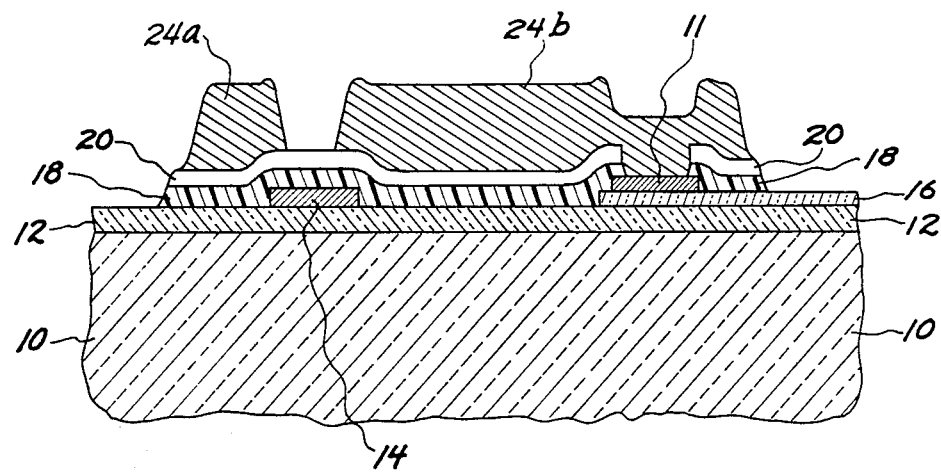
Figure 7:
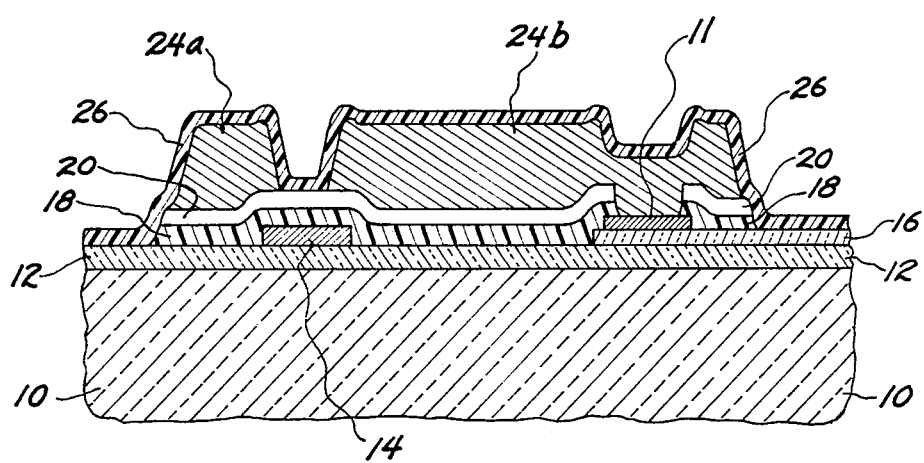

Next, a source and drain metallization layer is deposited over the workpiece and patterned so as to provide source electrode contact 24a and drain electrode contact 24b, as shown in FIG. 5. The source and drain metallization layer is preferably disposed by sputtering. In particular, it is noted herein that the presence of tab 11 permits the utilization of aluminum as an upper level source and drain material. It is noted that there is no direct contact between upper level metallization 24b and pixel electrode 16. All contact is preferably made through conductive, protective tab 11, which preferably comprises molybdenum. However, other refractory metals may be employed in and for tab 11. It is also noted that aluminum metallization material may be etched through the use of solutions such as PAWN (phosphoric, acetic and weak nitric acid). It is also noted that the etching of source/drain metallization layer material is carried out in such a way as to provide a channel in this material over gate electrode 14 so as to provide the desired field effect transistor structure. It is also noted that the use of aluminum as an upper level metallization material avoids the problem of electrode contact of molybdenum to amorphous silicon material. However, it is noted that if molybdenum is employed as an upper level metallization material, that it is possible to provide a N+ doped amorphous silicon layer within the top surface of layer 20 to enhance electrical contact to the molybdenum. Next, the structure illustrated in FIG. 5 is patterned so as to form layers 18 and 20 into island structures comprising FET devices in electrical contact with pixel electrodes 16. The island structure is more particularly illustrated in FIG. 6. Lastly, it is desirable to further include a passivation layer lying over the resulting substrate. This result is shown in FIG. 7 in which it is seen that passivation layer 26 has been deposited. Layer 26 preferably comprises a material such as silicon nitride. Layer 26 is preferably formed by plasma deposition. Accordingly, the structure illustrated in FIG. 7 results. For a full appreciation of the present invention, it is useful to compare FIGS. 2 and 7.

From the above, it should be appreciated that the presence of a tab structure, coupled with utilization of a relatively small via opening in the gate insulation layer and the amorphous silicon layer provide a facile means for protecting pixel electrode material at all stages of processing. It is further seen that the protection provided permits a wider selection of gate material to be employed together with a wider selection of upper level source/drain metallization material. In particular, it is seen that the protective structure of the present invention permits the utilization of aluminum for source, drain and gate metallization. Accordingly, it is seen that the full benefits of the use of aluminum are provided, and in particular, it is seen that its optical opacity in the gate region provides advantages with respect to undesired photo-induced discharge through the field effect transistor devices.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A process for the fabrication of thin film field effect transistors in active matrix liquid crystal display devices, said process comprising the steps of:

disposing a gate metallization layer pattern on an insulative substrate, said pattern including gate electrodes and gate drive lines;

disposing a pixel electrode pattern on said insulative substrate;

disposing a protective, conductive tab on a portion of at least some of said pixel electrodes;

disposing a layer of protective insulative material over said gate metallization layer pattern, said pixel electrode pattern and said conductive tabs;

disposing a layer of intrinsic amorphous silicon over said protective insulative material;

providing a via opening through said protective, insulative layer and said intrinsic amorphous silicon to said conductive tab;

disposing a source and drain metallization layer over said intrinsic amorphous silicon layer and in contact with said tab through said via opening;

patterning said source and drain metallization layer, said patterning including the formation of a channel region in said source and drain metallization layer, said channel being disposed over said gate electrodes; and patterning said intrinsic amorphous silicon and said protective insulative material down to the level of said insulative substrate and said pixel electrode material so as to form thin film, field effect transistor devices associated with said pixel electrodes in said pixel electrode pattern.

2. The fabrication process of claim 1 in which said gate metallization layer pattern is disposed by chemical vapor deposition and plasma etching.

3. The fabrication process of claim 1 in which said pixel electrode pattern is disposed by sputter deposition and wet etching.

4. The fabrication process of claim 1 in which said protective insulative material is disposed by plasma enhanced chemical vapor deposition.

5. The fabrication process of claim 1 in which said amorphous silicon is disposed by plasma enhanced chemical vapor deposition.

6. The fabrication process of claim 1 in which said source and drain metallization layer is disposed by sputtering.

7. The fabrication process of claim 1 further including disposing a silicon nitride passivation layer over said resulting substrate.

8. The fabrication process of claim 7 in which said silicon nitride passivation layer is formed plasma deposition.

9. The fabrication process of claim 1 in which said source and drain metallization comprises aluminum.

10. The fabrication process of claim 1 in which said pixel electrode pattern comprises indium tin oxide.

11. A cell structure for matrix addressed liquid crystal displays, said structure comprising:

an insulative substrate;

a gate metallization layer disposed on said insulative substrate in a pattern including a gate drive line and a gate electrode;

a pixel electrode disposed on said insulative substrate;

a conductive, protective tab disposed on a portion of said pixel electrode;

an island structure including a layer of protective insulative material, a layer of intrinsic amorphous silicon and a conductive layer, said island exhibiting a channel in said conductive layer, said channel being disposed over said gate electrode of said gate metallization layer so as to form a field effect transistor device having source and drain electrodes one of which is electrically connected to said conductive tab through a via opening in said protective insulative material and said amorphous silicon layers.

12. The cell structure of claim 11 in which said insulative substrate comprises glass.

13. The cell structure of claim 11 in which said protective insulative material comprises silicon nitride.

14. The cell structure of claim 11 which further includes a passivating cap comprising silicon nitride.

15. The cell structure of claim 11 in which the drain of said field effect transistor device is connected to said pixel electrode.

16. The cell structure of claim 11 in which said pixel electrode comprises indium tin oxide.

* * * * *